(12) United States Patent
Huang

(10) Patent No.: US 7,079,427 B2
(45) Date of Patent: Jul. 18, 2006

(54) SYSTEM AND METHOD FOR A HIGH-SPEED ACCESS ARCHITECTURE FOR SEMICONDUCTOR MEMORY

(75) Inventor: Chien-Hua Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/967,447

(22) Filed: Oct. 18, 2004

(65) Prior Publication Data

US 2006/0002195 A1    Jan. 5, 2006

Related U.S. Application Data

(60) Provisional application No. 60/585,023, filed on Jul. 2, 2004.

(51) Int. Cl.
  *G11C 7/10* (2006.01)
(52) U.S. Cl. ............... 365/189.05; 365/189.03; 365/190
(58) Field of Classification Search ........... 365/189.05, 365/189.03, 190, 230.05, 230.08
See application file for complete search history.

(56) References Cited

U.S. PATENT DOCUMENTS

| | | | |
|---|---|---|---|
| 4,764,900 A * | 8/1988 | Bader et al. ........... | 365/189.08 |
| 4,875,169 A | 10/1989 | Synovec et al. | |
| 4,920,517 A | 4/1990 | Yamauchi et al. | |
| 5,596,521 A | 1/1997 | Tanaka et al. | |
| 5,781,466 A | 7/1998 | Tanaka et al. | |
| 5,818,261 A * | 10/1998 | Perner ................... | 326/86 |
| 6,172,920 B1 | 1/2001 | Dhong et al. | |
| 6,442,089 B1 * | 8/2002 | Fletcher et al. ......... | 365/207 |
| 6,458,644 B1 | 10/2002 | Hardee | |
| 6,552,944 B1 | 4/2003 | Fifield et al. | |
| 6,643,160 B1 | 11/2003 | Hardee | |
| 6,930,941 B1 * | 8/2005 | Nakase ................... | 365/205 |
| 2003/0002349 A1 * | 1/2003 | Pilo et al. .............. | 365/189.01 |

OTHER PUBLICATIONS

Osaka, K-I, et al., "A 2ns Access, 285MHz, Two-Port Cache Macro Using Double Global Bit-Line Pairs," IEEE International Solid-State Circuits Conference (1997) pp. 402-403, 494.

Zhao, C., et al., "An 18-Mb, 12.3-GB/s CMOS Pipeline-Burst Cache SRAM with 1.54 Gb/s/pin," IEEE Journal of Solid-State Circuits, vol. 34, No. 11 (Nov. 1999) pp. 1564-1570.

* cited by examiner

*Primary Examiner*—Tuan T. Nguyen
*Assistant Examiner*—Dang Nguyen
(74) *Attorney, Agent, or Firm*—Slater & Matsil, L.L.P.

(57) ABSTRACT

A memory device is provided, which includes a first device, a second device, and a memory cell. The first device is electrically connected to a first plurality of wires. The first device is adapted to generate a small swing signal in the first plurality of wires. The second device is electrically connected to the first device by the first plurality of wires. The memory cell is electrically connected to the second device by a second plurality of wires. The second device is adapted to sense a small swing signal in the first plurality of wires, and to generate a full swing signal on the second set of wires in response to the small swing signal. The memory cell stores the full swing signal.

19 Claims, 18 Drawing Sheets

SYSTEM AND METHOD FOR A HIGH-SPEED ACCESS ARCHITECTURE FOR SEMICONDUCTOR MEMORY

This application claims the benefit of U.S. Provisional Application No. 60/585,023 filed on Jul. 2, 2004, entitled System and Method for a High Speed Access Architecture for Semiconductor Memory, which application is hereby incorporated herein by reference.

TECHNICAL FIELD

The present invention relates generally to a system and method for semiconductor devices and more particularly to a system and method for a high-speed access architecture for semiconductor memory.

BACKGROUND

Complementary metal-oxide-semiconductor (CMOS) technology is the dominant semiconductor technology used for the manufacture of ultra-large scale integrated (ULSI) circuits today. ULSI circuits commonly include memory devices for the storage of data.

FIG. 1 shows the basic components of a generic memory device 100. Many memory devices have an architecture similar to the memory device 100, such as static random access memories (SRAMs) and dynamic random access memories (DRAMs). External devices 104, which reside outside the memory device 100, read data from, and write data to, the memory device 100 by interfacing with the controller 102. The controller 102, in turn, operates the devices inside the memory device 100, including the row decoder 101 and column decoder 106 to read binary data from and write binary data to the memory cells 112 in the memory array 108. A memory device such as an SRAM chip may have the memory architecture of FIG. 1 with memory cells 112 such as the six transistor SRAM cell in FIG. 2. A memory device such as a DRAM chip may have the memory architecture of FIG. 1 with memory cells 112 such as the DRAM cell in FIG. 3.

Memory devices 100 typically require memory arrays 108 with millions, billions, or more memory cells 112 organized into rows 107 and columns 109. The repeated elements in FIG. 1, including rows 107, columns 109, and memory cells 112 in the rows 107 and columns 109 are symbolized with repeated dots ". . . ".

A memory controller 102 selectively controls the data bus 114 to read from, and write to the memory cells 112 in the memory array 108. A data bus may be generally considered to include at least two circuits interconnected by one or more wires. The data bus of the prior art 114 in FIG. 1 includes a write driver 116 and a read amplifier 111 electrically connected to a column 109 of memory cells 112 by the bitline wires BL and BLB. The bitline wires BL and BLB extend along the entire length of the memory column 109 and are electrically connected to the diffusion regions of transistors (not shown) in each memory cell 112.

FIG. 4 shows the voltage waveform $V_{BLB1}$ of a data bus wire BLB1 (not shown) which is not heavily loaded. FIG. 4 also shows the voltage waveform $V_{BLB2}$ of a data bus wire BLB2 (not shown) which is heavily loaded. Both signals begin transitioning towards zero volts at time $t_0$ and reach the switching threshold of Vdd/2 at time $t_1$ and $t_2$ respectively. The voltage waveform $V_{BLB2}$ of the heavily loaded bitline wire BLB2 slowly descends toward zero volts beginning at time $t_0$ and reaches the switching threshold of Vdd/2 at time $t_2$, much later than the arrival of the voltage waveform $V_{BLB1}$ at the same switching threshold. The difference in time required to reach the switching point between the voltage signal $V_{BLB1}$ and the voltage signal BLB2 is the delay $t_A$ caused by the heavy loading of the wire BLB2. A data bus suffering from a slow transient such as $V_{BLB2}$ in FIG. 4 will have a slower access time. The slow access time corresponds to a low operating frequency.

Therefore, what is needed is a system and method for a high-speed access architecture for semiconductor memory devices, specifically, a system and method for high-speed access architecture of large-scale semiconductor memories.

SUMMARY OF THE INVENTION

These and other problems are generally solved or circumvented, and technical advantages are generally achieved, by illustrative embodiments of the present invention which provides a high-speed access architecture for semiconductor memory devices. In accordance with one aspect of the present invention, a memory device is provided, which includes a first device, a second device, and a memory cell. The first device is electrically connected to a first plurality of wires. The first device is adapted to generate a small swing signal in the first plurality of wires. The second device is electrically connected to the first device by the first plurality of wires. The memory cell is electrically connected to the second device by a second plurality of wires. The second device is adapted to sense a small swing signal in the first plurality of wires, and to generate a full swing signal on the second set of wires in response to the small swing signal. The memory cell stores the full swing signal.

In accordance with another aspect of the present invention, a memory access architecture is provided, which includes a first device, a second device, a memory cell, and a third device. The first device is electrically connected to a first pair of wires. The first device is adapted to generate a small swing signal in the first pair of wires. The second device is electrically connected to the first device by the first pair of wires. The second device is adapted to sense a first small swing signal in the first pair of wires and in response generate a full swing signal in a second set of wires. The memory cell is electrically connected to the second device by a second pair of wires. The memory cell stores the full swing signal. The memory cell is adapted to generate a second small swing signal in the second pair of wires. The third device is electrically connected to the memory cell by the second pair of wires, wherein upon sensing the second small swing signal in the second pair of wires. The third device generates a third small swing signal in the third pair of wires. The third device is electrically connected to a fourth device by a third pair of wires.

In accordance with still another aspect of the present invention, a memory access architecture is provided, which includes a first device, a second device, a memory cell, and a third device. The first device is electrically connected to a first pair of wires. The first device is adapted to generate a small swing signal in the first pair of wires. The second device is electrically connected to the first device by the first pair of wires. The second device is adapted to sense a first small swing signal in the first pair of wires and in response generate a full swing signal in a second set of wires. The memory cell is electrically connected to the second device by a second pair of wires. The memory cell stores the full swing signal. The memory cell is adapted to generate a second small swing signal in the second pair of wires. The third device is electrically connected to the memory cell by the second pair of wires, wherein upon sensing the second small swing signal in the second pair of wires. The third device generates a third small swing signal in the third pair of wires. The third device is electrically connected to the fourth device and to the first device by the first pair of wires.

In accordance with yet another aspect of the present invention, a method of memory device operation is provided. This method includes the following steps described in this paragraph, the order of which may vary. A first small swing signal is a generated onto a first data bus. Upon detecting the first small swing signal, a full swing signal are generated on a second data bus. The second data bus is electrically connected to a group of memory cells.

In accordance with another aspect of the present invention, a method of memory device operation is provided. This method includes the following steps described in this paragraph, the order of which may vary. Writing to a first memory cell. The writing to the first memory cell includes: generating a first small swing signal onto a first pair of wires, wherein the first small swing signal is generated by a write driver electrically connected to a first transmission buffer (also called write-buffer, since it deals with signals for writing) by the first pair of wires; sensing the first small swing signal on the first pair of wires and generating a first full swing signal on a second pair of wires in response to the first small swing signal, wherein the second pair of wires electrically connect the first transmission buffer to the first memory cell; and storing the first full swing signal in the first memory cell. Reading from a second memory cell. The reading from the second memory cell includes: generating a second small swing signal onto a third pair of wires, the second small swing signal being generated by the second memory cell, the second memory cell being electrically connected to a second transmission buffer (also called read-buffer, since it deals with signals for reading) by the third pair of wires; and sensing the second small swing signal on the third pair of wires and generating a third small swing signal on a fourth pair of wires in response to the second small swing signal, wherein the fourth pair of wires electrically connect a read amplifier to the second transmission buffer. The writing to the first memory cell and the reading from the second memory cell are performed independently with respect to time.

BRIEF DESCRIPTION OF THE DRAWINGS

For a more complete understanding of the present invention, and the advantages thereof, reference is now made to the following descriptions taken in conjunction with the accompanying drawings, in which:

FIG. 13b is a schematic of the static random access memory (SRAM) cell device in accordance with the embodiment of the present invention shown in FIG. 13a;

FIG. 13c is a schematic of the data latch comprising the dynamic random access memory (DRAM) bit cells in accordance with the embodiment of the present invention shown in FIG. 13a.

DETAILED DESCRIPTION OF ILLUSTRATIVE EMBODIMENTS

The making and using of the presently illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

The present invention will be described with respect to illustrative embodiments in a specific context, namely a high-speed access architecture for semiconductor memory devices. The first illustrative embodiment of the present invention has a basic data bus architecture, as shown in FIG. 5c.

Figure 1:
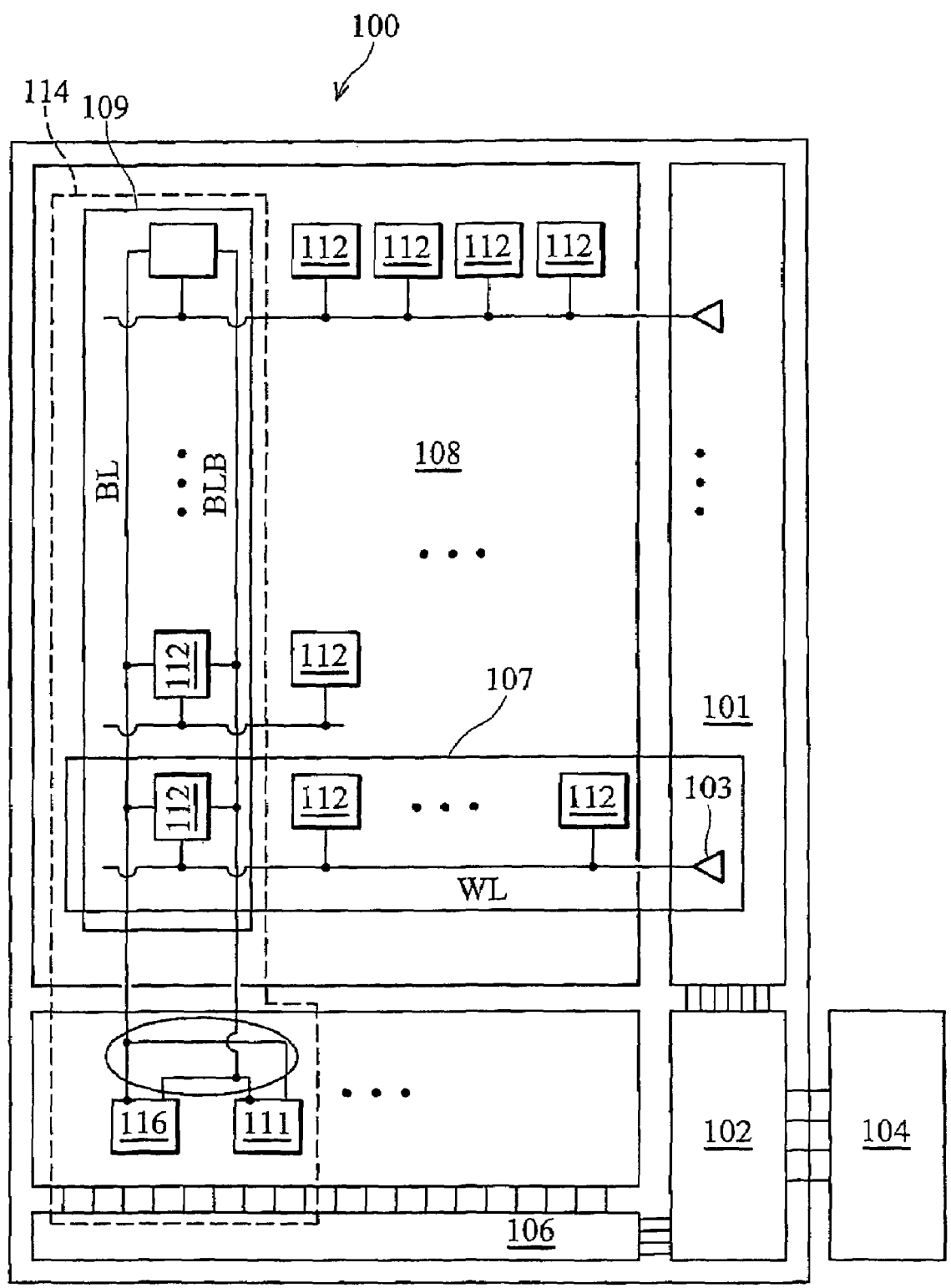
FIG. 1 is a simplified schematic of a memory structure illustrating command elements of a data bus architecture used in numerous types of memory devices.
Figure 2:
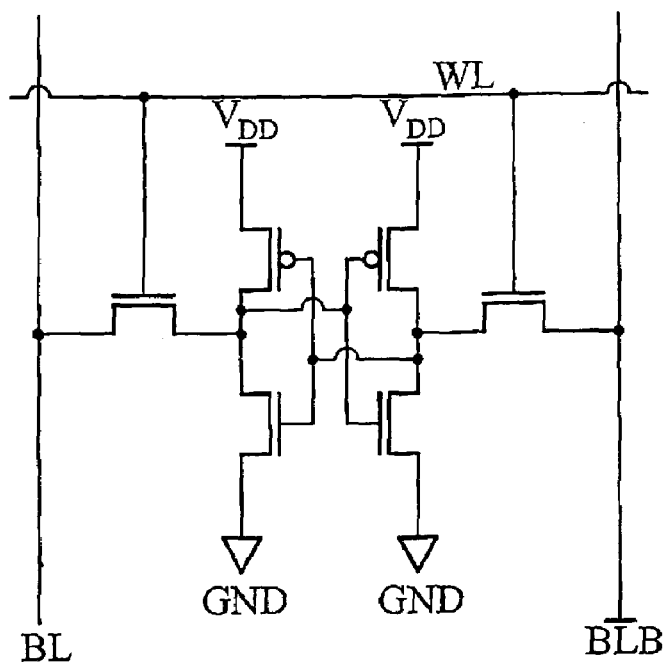
FIG. 2 is a schematic of the six transistor static random access memory (6T SRAM) cell.
Figure 3:
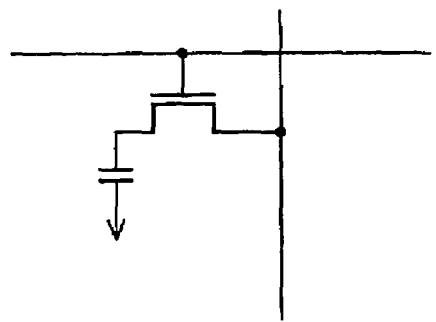
FIG. 3 is a schematic of the dynamic random access memory (DRAM) cell.
Figure 4:
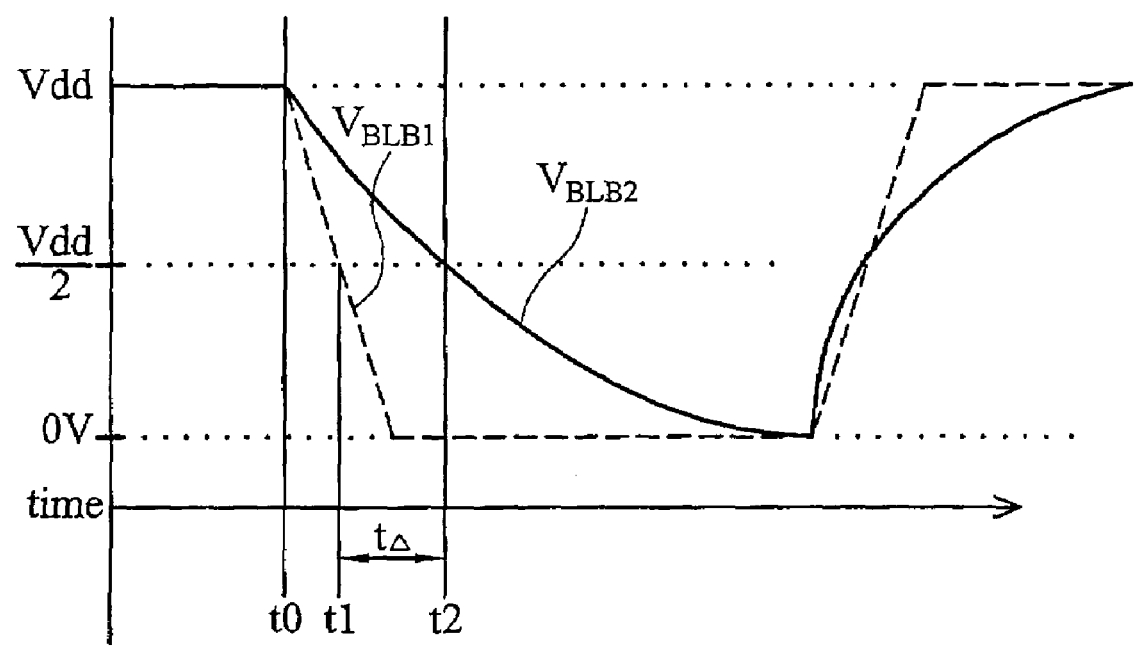
FIG. 4 is a waveform diagram illustrating the retardation of a signal transient on a wire over-loaded with parasitic capacitance.
Figure 5A:
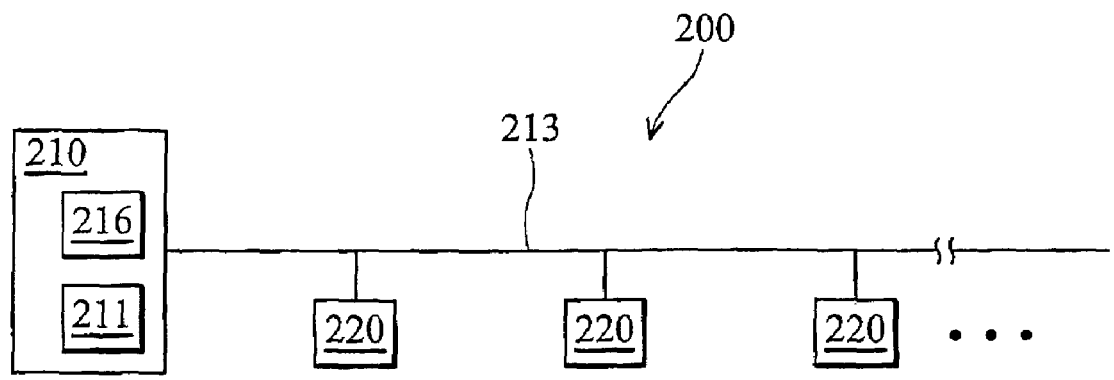
FIG. 5a is a schematic view of a global data bus in accordance with the first illustrative embodiment of the present invention.
Figure 5B:
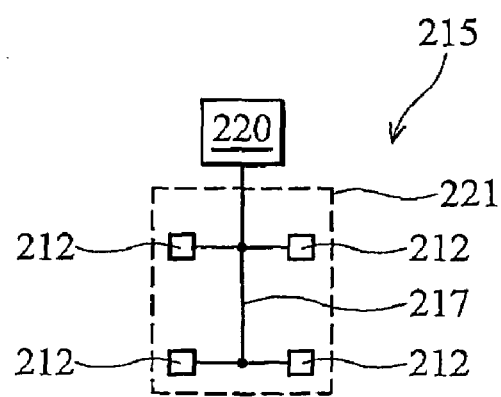
FIG. 5b is a schematic view of a local data bus in accordance with the first illustrative embodiment of the present invention.
Figure 5C:
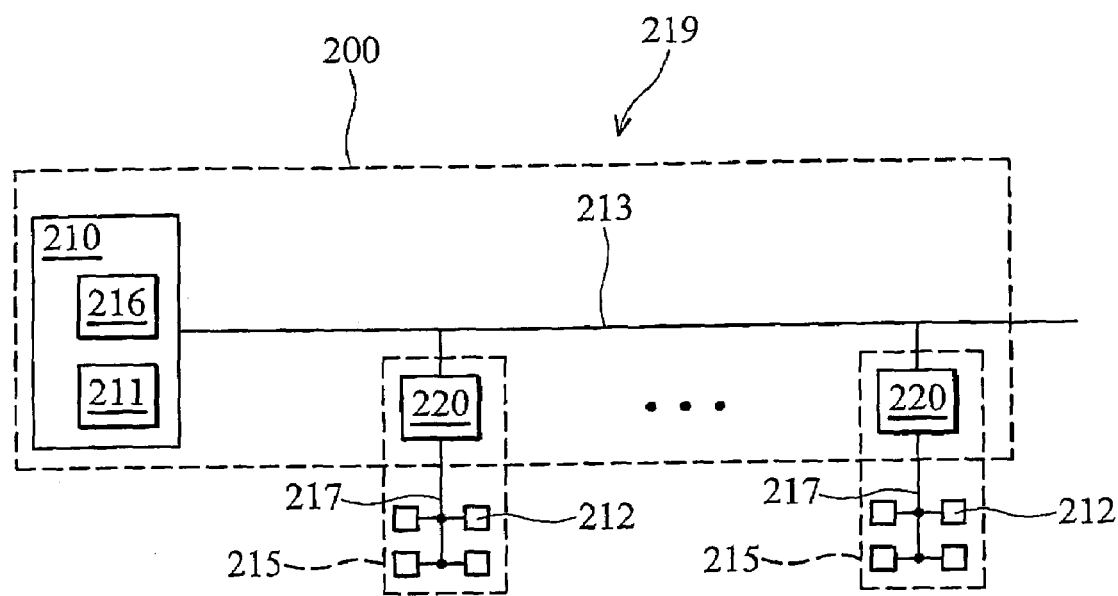
FIG. 5c is a schematic view of the data bus in accordance with the first illustrative embodiment of the present invention.

The global data bus 200 in FIG. 5a and one or more local data bus structures 215 shown in FIG. 5b are combined to form the data bus 219 shown in FIG. 5c. With reference to FIG. 5a, the global data bus 200 includes a write driver 216, and a read amplifier 211 in a driver/amplifier block 210 connected to any number of transmission buffers 220 by a transmission medium 213. The global data bus transmission medium 213 in FIG. 5a is preferably a pair of wires, or alternatively four wires. The transmission medium 213 may also be any number of wires, including one wire, an odd numbers of wires, or an even numbers of wires, for example. The schematic of FIG. 5a purposefully does not show specific connectivity of the transmission buffers 220 to the transmission medium 213 or specific connectivity of the write driver 216 and read amplifier 211 to the global transmission medium 213. This is because illustrative embodiments include global data bus structures 200 with any number of connection configurations between the transmission medium 213, transmission buffers 220, the read amplifier 211 and the write driver 216. One or more of the transmission buffers 220 may be an interface buffer for communication with devices external to the memory device in which the global data bus 200 resides.

Figure 5D:
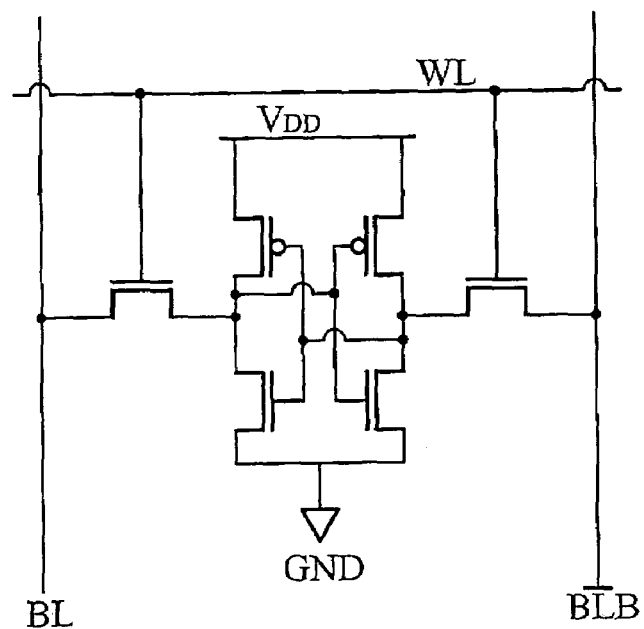
FIG. 5d is a schematic view of the memory cell shown in FIGS. 5b and 5c.

A local data bus 215 of the illustrative embodiment is shown in FIG. 5b. The local data bus 215 consists of a transmission buffer 220 and any number of memory cells 212. An example of one of the memory cells 212 is the SRAM cell shown in FIG. 5d. The four memory cells 212 in FIG. 5b represent a group of memory cells 221. The number of memory cells 212 in the group 221 are preferably selected such that the accumulated capacitance of the memory cells on transmission medium 217 is small enough to allow suitably fast signal switching. The local data bus transmission medium 217 is preferably two wires interconnected to form a bi-directional bus. Alternatively, the local transmission medium 217 may include any number of wires and have any configuration of connections to the transmission buffer 220 and to the memory cells 212.

Figure 6:
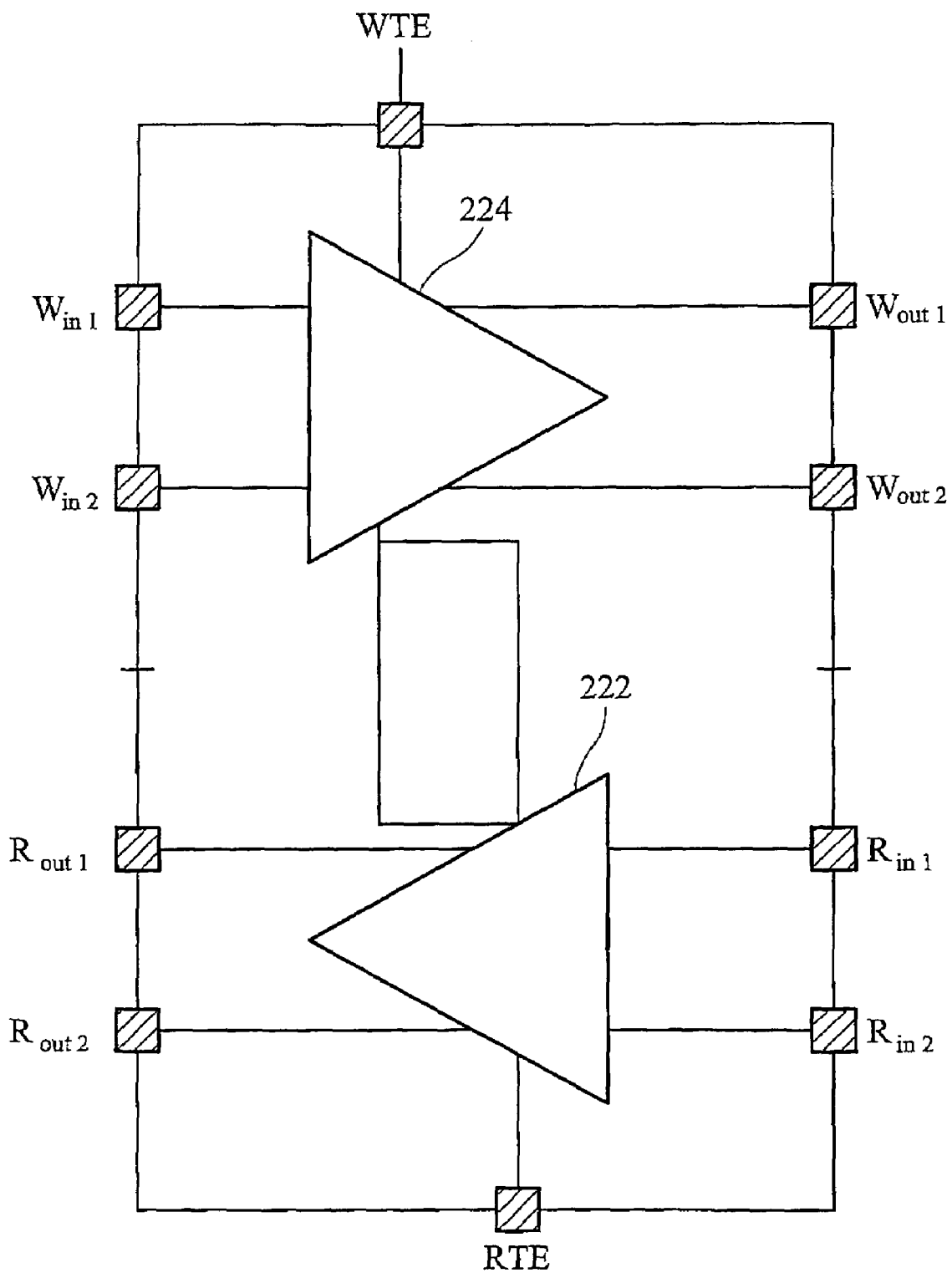
FIG. 6 is a schematic view of the transmission buffer in accordance with the first illustrative embodiment of the present invention.

FIG. 6 shows a schematic of the transmission buffer 220. The transmission buffer 220 has of a write buffer 224 and a read buffer 222. The read buffer 222 has two inputs $R_{in1}$ and $R_{in2}$, and two outputs $R_{out1}$, and $R_{out2}$. The write buffer 224 has two inputs $W_{in1}$ and $W_{in2}$, and two outputs $W_{out1}$, and $W_{out2}$.

The transmission buffer 220 also has a read transfer enable (RTE) wire connected to the read buffer 222 and a write transfer enable (WTE) wire connected to the write buffer 224. The RTE and WTE carry the transfer enable signal. When the write transfer enable (WTE) signal is transferred, write buffer 224 is enabled and in an operating state, thereby responding selectively to electrical signals on their inputs $W_{in1}$ and $W_{in2}$. When the read transfer enable (RTE) signal is transferred, the read buffer 222 is in an operating state, thereby responding selectively to electrical signals generated on the inputs $R_{in1}$ and $R_{in2}$.

When the write buffer 224 is in an operating state, it will generate a full swing signal in the output terminals $W_{out1}$ and $W_{out2}$ in response to a small swing signal in the input terminals $W_{in1}$ and $W_{in2}$. When the read buffer 222 is in an operating state, it will generate a small swing signal in the output terminals $R_{out1}$ and $R_{out2}$ in response to a small swing signal in the input terminals $R_{in1}$ and $R_{in2}$.

Figure 7:
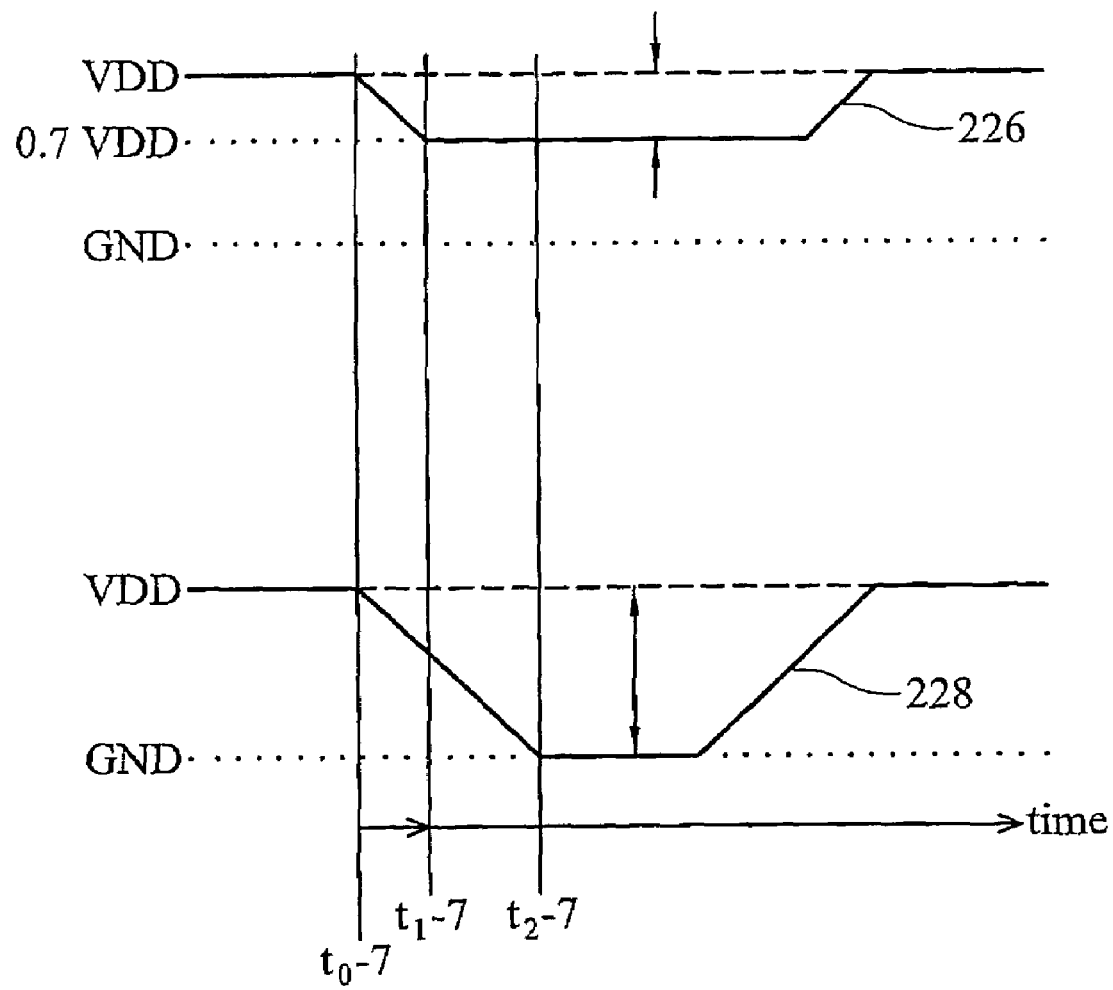
FIG. 7 is a waveform diagram comparing the amplitudes of a full swing signal and a small swing signal.

An example of a small swing signal 226 and a full swing signal 228 are shown in FIG. 7. The small swing signal 226 in FIG. 7 transitions from VDD at about time $t_0$-7 to a stabilized voltage of about 70% of VDD at time $t_1$-7. In illustrative embodiments of the present invention, the voltage level of small swing signals may transition from VDD to any stabilized voltage level between VDD and zero volts. For example, small swing signals may be about 50% of VDD, about 75% of VDD, or about 25% of VDD. In contrast to the small swing signal 226, the full swing signal 228 transitions from VDD at time $t_0$-7 and stabilizes to about ground voltage (for example, zero volts) at time $t_2$-7. The waveform diagram of FIG. 7 illustrates that a full swing signal takes longer to reach a stabilized value than the small swing signal does.

It should be noted that small swing signals are distinct from voltage droops or other undesired voltage events that may appear in the local and global data bus transmission mediums. Undesired voltage events may bring the voltage in a wire down to a percentage of VDD at random times and for comparatively short durations. In contrast, small swing signal properties are well known in the art, such as fall time, rise time and a stabilized voltage level. It should be further noted that although memory devices of the present invention may be manufactured with a desired small swing voltage level, it is well known that the actual voltage level of the finished product may not be the desired voltage level. Rather, the small swing voltage level of the finished product will typically be within a range of the desired level, such as within +/−5%, +/−10%, and +/−30%, for example. As is well known, the small swing voltage level of the finished product will depend on various factors, including temperature variations, manufacturing process variations, and voltage source variations, for example.

Figure 8A:
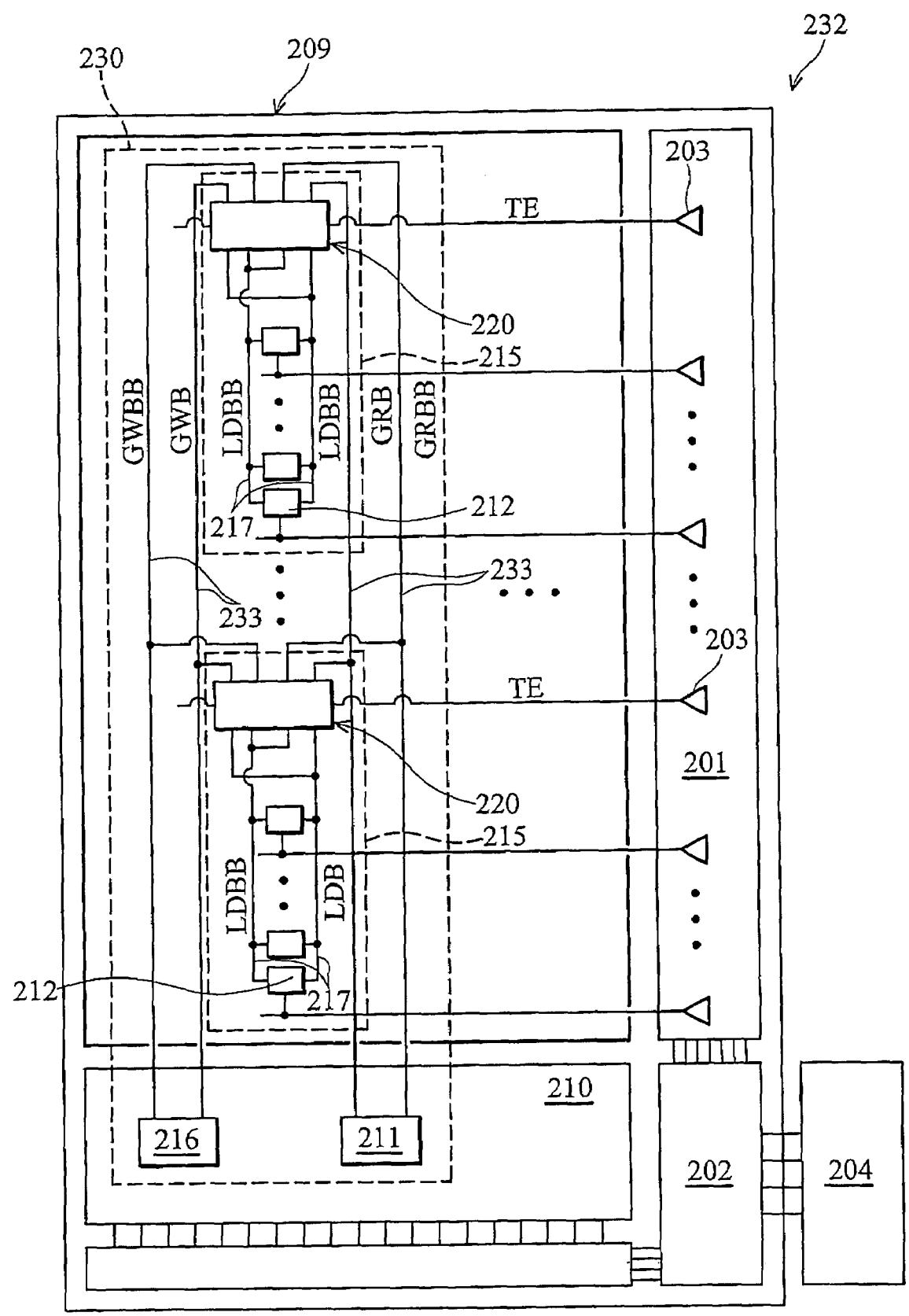
FIG. 8a is a schematic of the SRAM device in accordance with the first illustrative embodiment of the present invention.

The first illustrative embodiment of the present invention, shown in FIG. 8a, includes a data bus 230 in an SRAM device 232. The SRAM device 232 may be an SRAM circuit in a system on a chip (SOC), or part of an SRAM chip in a computer, for example. The data bus 230 of the first illustrative embodiment comprises a pair of global data buses 233 that are for global read and global write functions. The global data bus 233 consists of four wires GWBB, GWB, GRB and GRBB. The transmission buffers 220 are connected to transfer enable signal buffers 203. The transfer enable signal buffers 203 are in row decoder 201.

Figure 8B:
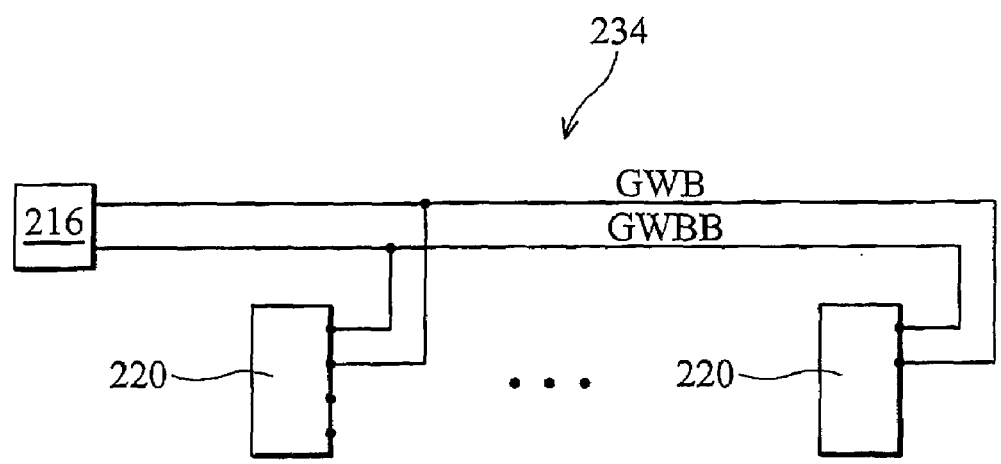
FIG. 8b is a schematic showing the first unidirectional bus that is a member of the global bus of the first illustrative embodiment.
Figure 8C:
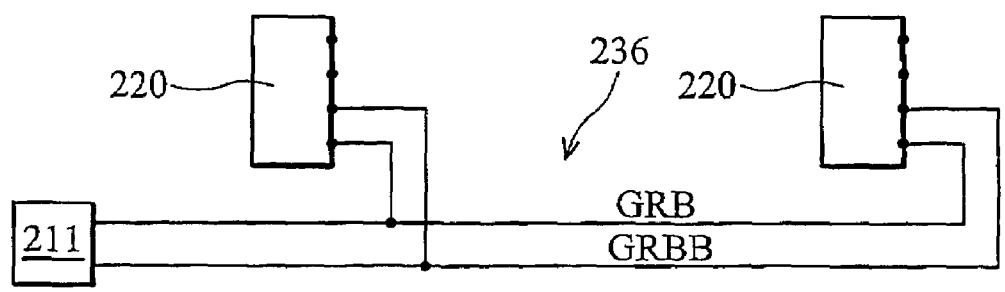
FIG. 8c is a schematic showing the second unidirectional bus that is a member of the global bus of the first illustrative embodiment.
Figure 8D:
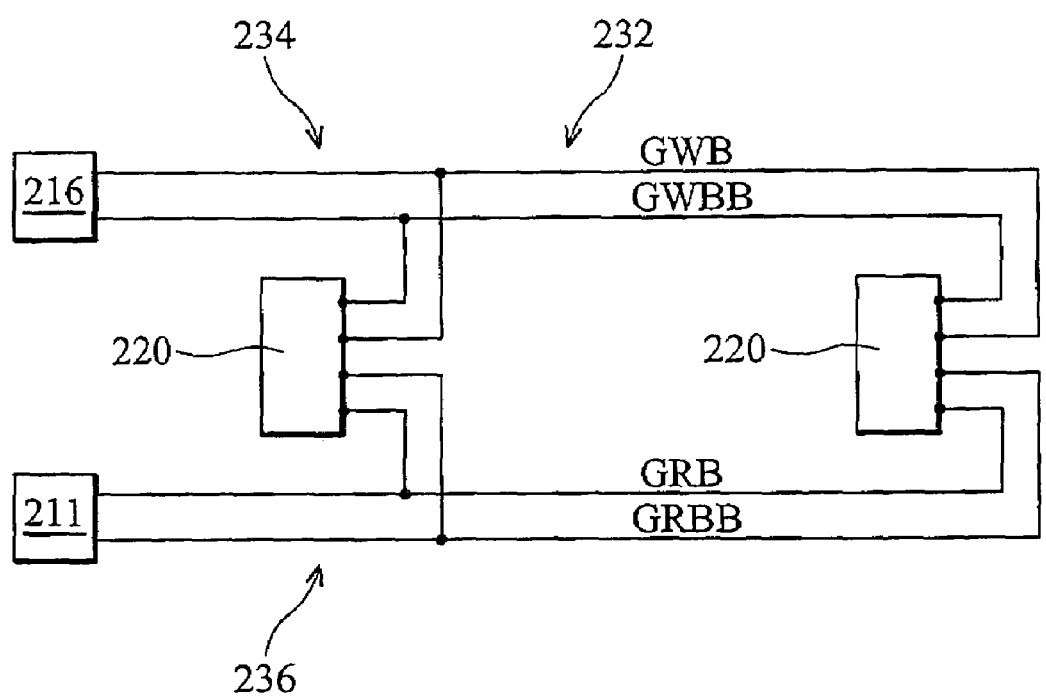
FIG. 8d is a schematic showing the first unidirectional bus and the second unidirectional bus combined to form the global data bus of the first illustrative embodiment.
Figure 8E:
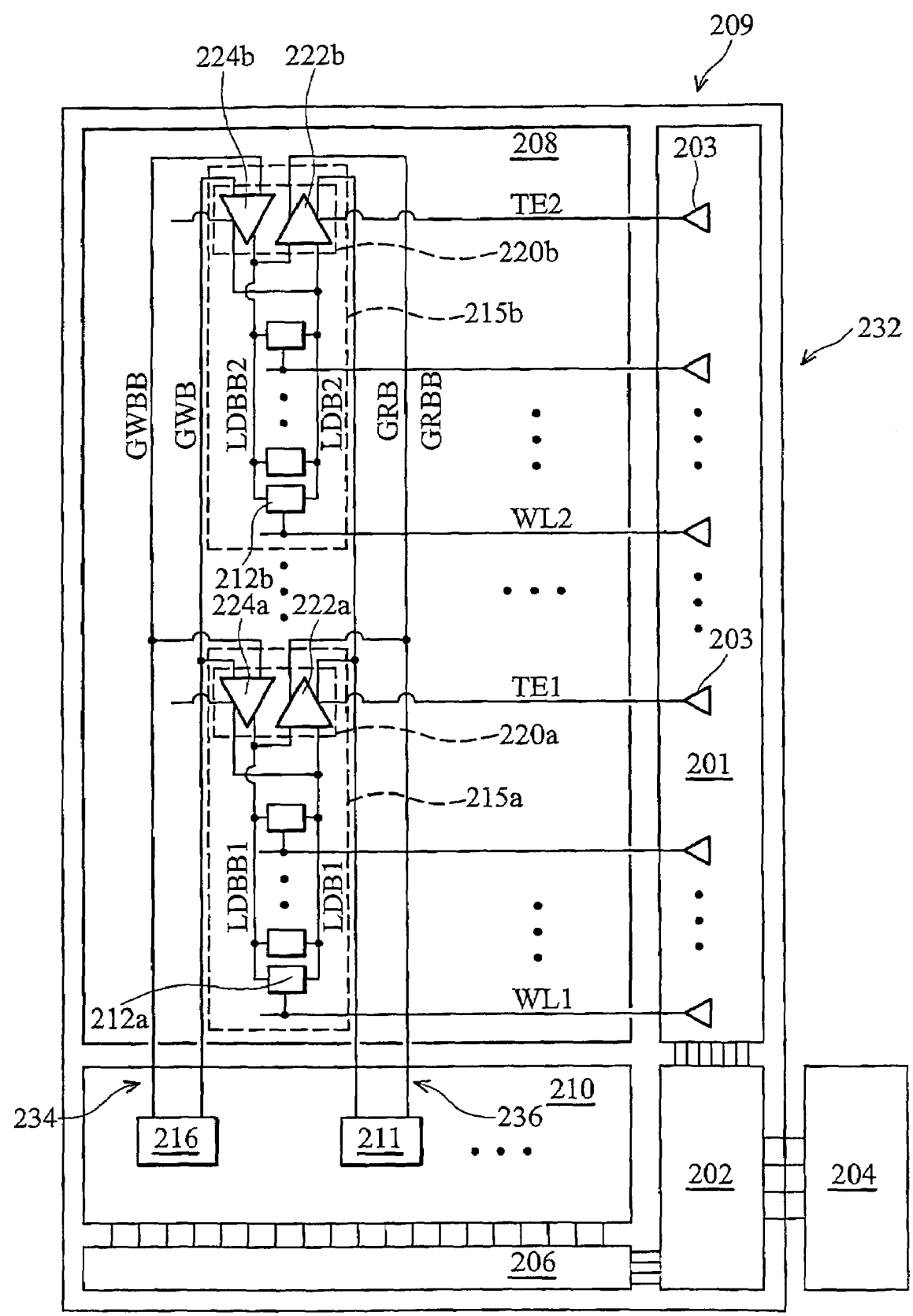
FIG. 8e is a schematic showing the schematic in FIG. 8a, and further showing the contents of the transmission buffers, in accordance with the first illustrative embodiment of the present invention.

The global data bus 233 may also be described as having two independent buses. The global data bus 233 includes a unidirectional write bus 234, shown separately in FIG. 8b, and a unidirectional read bus 236, shown separately in FIG. 8c. The write bus 234 includes the wires GWBB and GWB, which electrically connects the write driver 216 to the transmission buffers 220. The unidirectional read bus 236 in FIG. 8c includes the wires GRBB and GRB electrically connected to the read amplifier 211 and the transmission buffers 220. The global data bus 233 in FIG. 8a, 8d and 8e is formed by combining the unidirectional write-only bus 234 of FIG. 8b with the unidirectional read-only bus 236 of FIG. 8c, as shown in FIG. 8d.

The transmission buffers 220 of the first illustrative embodiment are adapted so that the unidirectional read bus 236 and the unidirectional write bus 234 of the global data bus 233 may operate independently. The unidirectional read bus 236 may transmit data from the transmission buffers 220 to the read amplifier 211 within the same period of time that data is transmitted from the write driver 216 to the transmission buffers 220 on the unidirectional write bus 234. Conventionally, a separated data read bus and data write bus allow the memory device to perform read and write access to a memory cell in a different local data bus at the same time. However, if the data bus is now shared for both read and write access, like the memory device 232, only one type of access is allowed to transmit the data on the bus in the same period of time. Thus the memory device 232 now performs a collision logic function (not shown) that prevents a read operation and a write operation from being performed to memory cells 212 in the same local data bus 215 within the same period of time.

With reference again to FIG. 8a, the memory cells 212 in the memory column 209 are grouped and placed in local data buses 215. The local data buses 215 are repeated any number of times in the column, as indicated by the repeating dots "...". Each local data bus 215 has a transmission buffer 220 electrically connected to a group of memory cells 212 by two cross-coupled wires LDB and LDBB.

Figure 9:
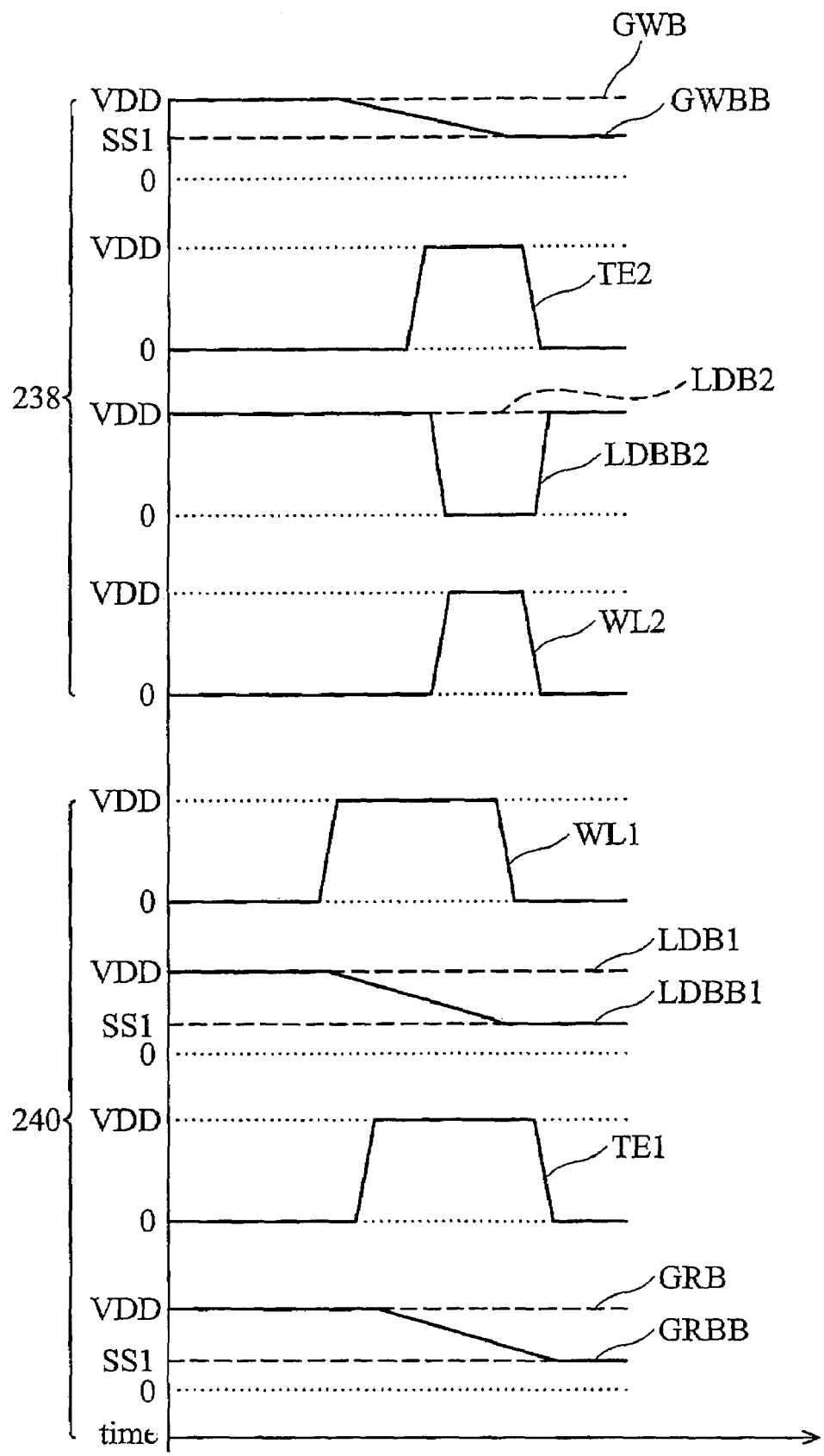
FIG. 9 is a waveform diagram showing the simultaneous read and write access operation performed in the SRAM device of the first illustrative embodiment.

The read operation and the write operation of the data bus 230 of the first illustrative embodiment are discussed below with reference to FIG. 8e and FIG. 9. FIG. 8e is the SRAM memory device 232 of FIG. 8a with the contents of the transmission buffers 220 exposed. FIG. 9 shows the voltage waveforms for the read operation 240 and for the write operation 238 of the first illustrative embodiment. The wordline wire WL1 is forced to VDD during the read operation 240. The transfer enable signal is enabled on the wire TE1 by forcing the voltage in the wire from zero volts to VDD. Forcing the wordline wire WL1 to VDD causes the memory cell 212a to generate a small swing signal on the local data bus wires LDBB1 and LDB1. The small swing signal is generated by transitioning LDBB1 from VDD to a stabilized small swing amplitude SS1. Upon sensing that the transfer enable signal has been enabled in the wire TEI, and upon sensing the small swing signal on the local data bus transmission wires LDB1 and LDBB1, the read buffer 222a in the transmission buffer 220a generates a similar small swing signal onto the global data bus transmission wires GRB and GRBB. The read amplifier 211 senses the small swing signal on the global read bus wires GRB and GRBB and propagates the signal for further processing.

In the first illustrative embodiment, the write operation 238 occurs within the same time frame as the read operation 240. The write driver 216 generates a small swing signal on the unidirectional write bus transmission wires GWB and GWBB. The transfer enable signal in the wire TE2 is enabled. Upon sensing that the transfer enable signal is enabled, and upon sensing the small swing signal in the global write transmission wires GWBB and GWB, the write buffer 224b in the transmission buffer 220b generates a full swing signal on the local data bus wires LDBB2 and LDB2. Forcing the wordline wire WL2 to VDD causes the memory cell 212b to store the full swing signal on the wires LDBB2 and LDB2.

Figure 10:
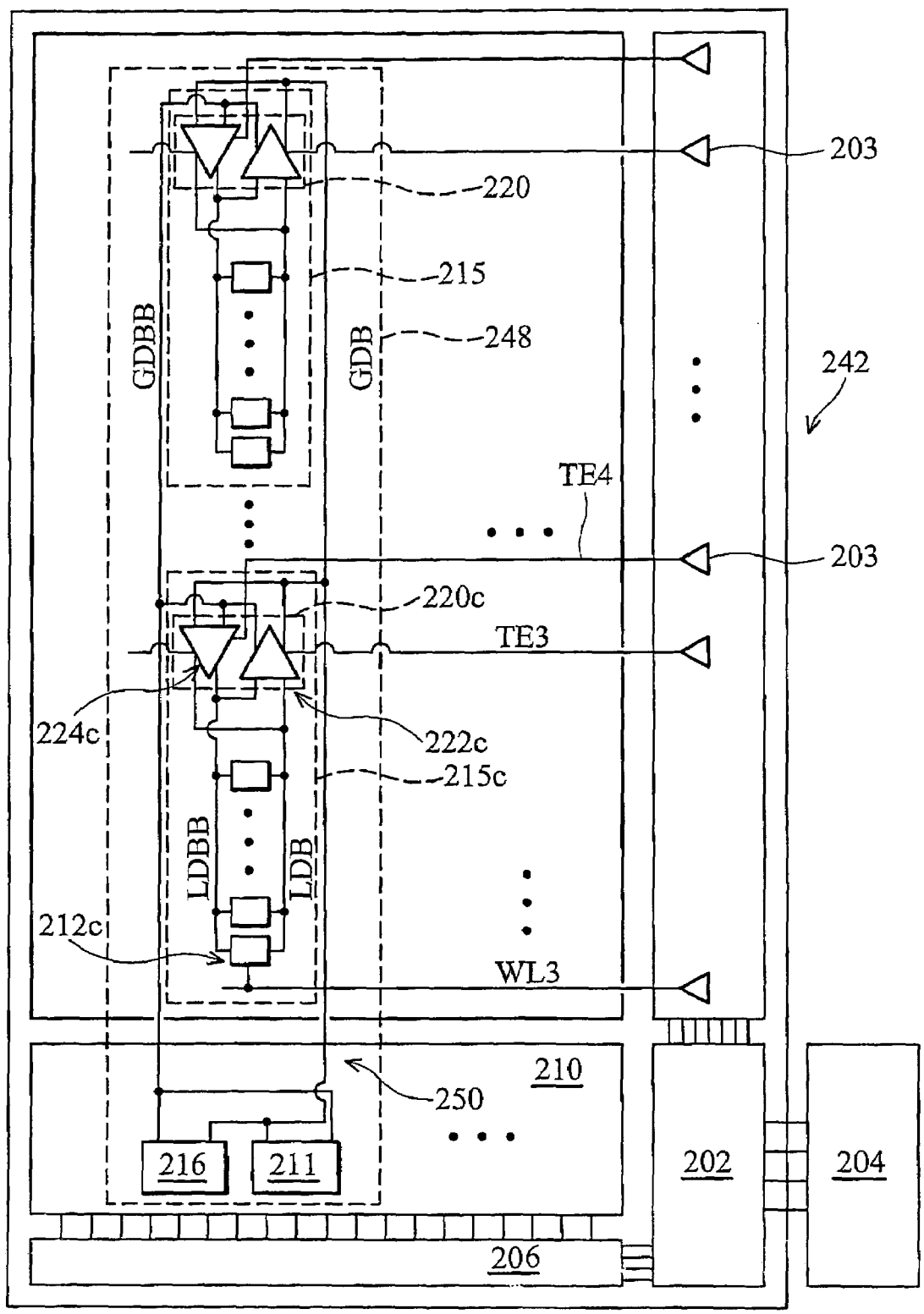
FIG. 10 is a schematic of the SRAM device in accordance with the second illustrative embodiment of the present invention.

The second illustrative embodiment shown in FIG. 10 has a data bus 248 that includes a global data bus 250 with a transmission medium having two cross-coupled wires GDBB and GDB. The two wires GDB and GDBB connect the read amplifier 211, the write driver 216, and any number of transmission buffers 220 to form the global data bus 250. The transmission buffers 220 and 220c are shown in FIG. 10 with the contents exposed. The global data bus 250 is coupled to the local data bus 215c via a transmission buffer 220c.

Figure 11:
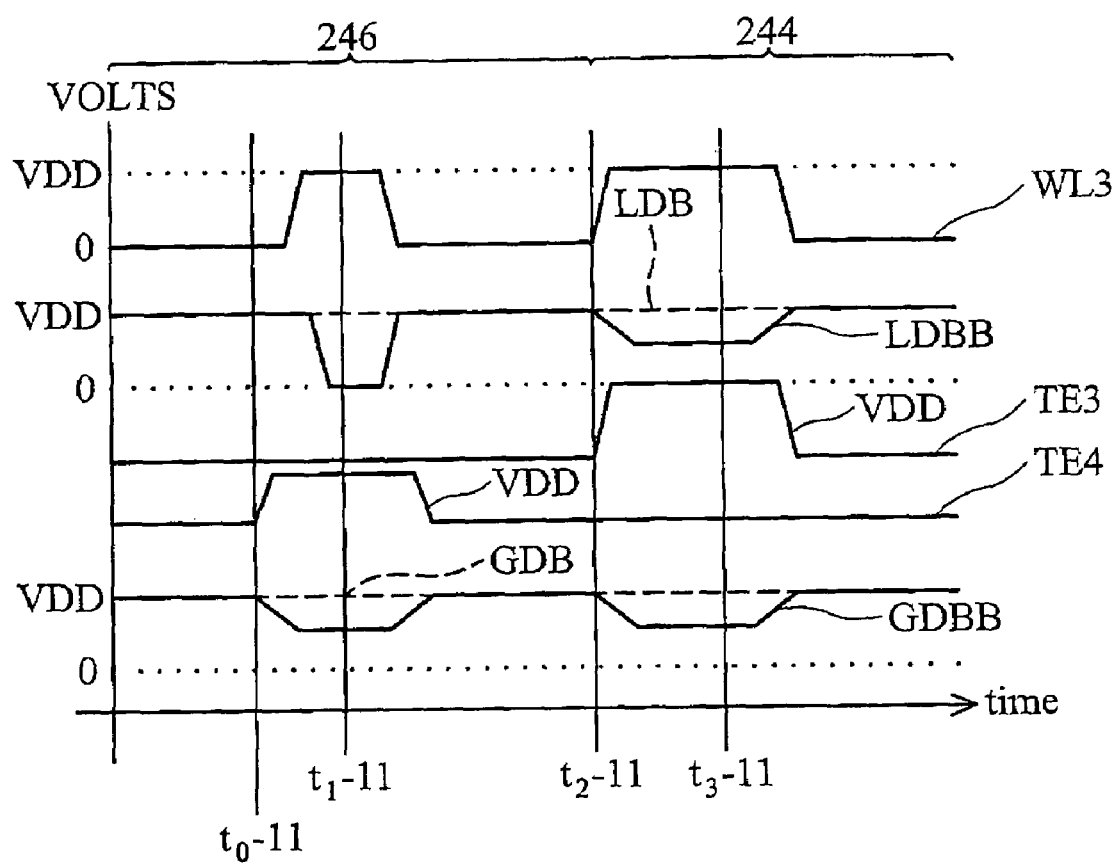
FIG. 11 is a voltage waveform diagram showing read and write operations in accordance with the second illustrative embodiment of the present invention.

Voltage waveforms showing the read 244 and write 246 operations in the second illustrative embodiment are shown in FIG. 11. Reference is also made to FIG. 10. Because the global data bus 250 is bidirectional, read 244 and write 246 operations must occur sequentially. The first operation starting at time $t_0$-11 is a write operation 246. The write driver 216 generates a small swing signal on the global data bus transmission wires in GDB and GDBB. The transmission enable signal is enabled by switching the voltage on the wire TE4 from zero volts to VDD. Upon sensing the small swing signal on the global data bus transmission wires GDB and GDBB, and upon sensing that the transfer enable signal has been enabled on the wire TE4, the write buffer 224c in the transmission buffer 220c generates a full swing signal on the local data bus transmission wires LDB and LDBB. Controller 202 activates the wordline WL3 by switching the voltage in the wire WL3 from zero volts to VDD. The memory cell 212c senses that the voltage on the wordline wire WL3 has risen to VDD and stores the full swing signal at time $t_1$-11. After time $t_1$-11 and before time $t_2$-11, the global data bus transmission wires GDB and GDBB, the wordline WL3, the wire TE4, and local data bus transmission wires LDB and LDBB return to a default state.

At time $t_2$-11, the read operation 244 on the data bus 248 of the second illustrative embodiment is performed. The controller 202 causes the wordline WL3 connected to the memory cell 212c to be activated by switching the voltage on the wordline wire from zero volts to VDD. In response, the memory cell 212c generates a small swing signal on the local data bus wires LDB and LDBB that is similar to the values stored in the memory cell 212c. The transfer enable signal is enabled on the wire TE3, thereby causing the read buffer 222c in the transmission buffer 220c to enter an operational state. The read buffer 222c senses the small swing signal on the local data bus wires LDB and LDBB and generates a small swing signal on the global data bus transmission wires GDB and GDBB. At time $t_3$-11 the read amplifier 211 senses the small swing signal on the global data bus wires GDB and GDBB and distributes the signal for further processing.

Figure 12A:
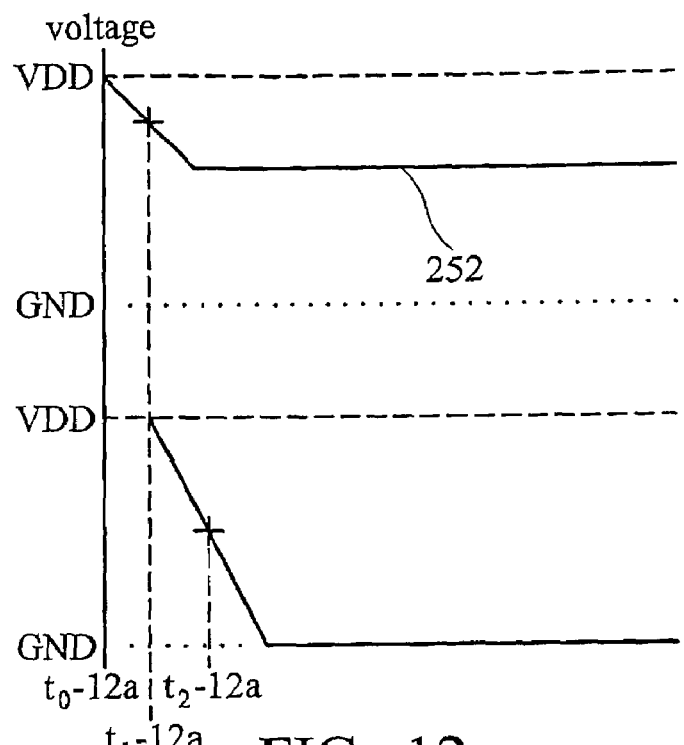
FIG. 12a is waveform diagram showing signal transients on the global bitline and a local bitline during a write sequence in the data bus of the first illustrative embodiment.
Figure 12B:
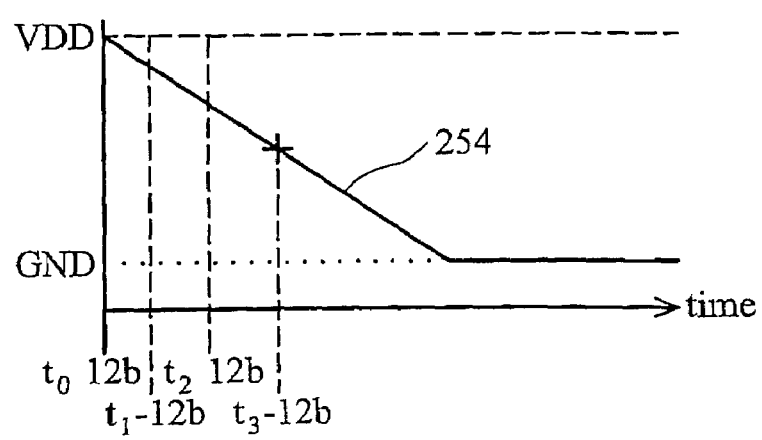
FIG. 12b is a waveform diagram illustrating the signal transients in the bitline of the prior art data bus during a write sequence.

In illustrative embodiments of the present invention, the write buffer in each transmission buffer provides increased memory speed by reducing the time required to transmit signals from the write driver to each memory cell. FIG. 12a shows the propagation of a write signal to a memory cell in an illustrative embodiment. A write driver generates a small swing signal 252 on a global transmission wire. The small swing signal reaches the switching threshold of an activated write buffer in a transmission buffer at about time $t_1$-12a. In response to the small swing signal 252, a write buffer generates a full swing signal on a local transmission wire. The signal is written to a memory cell at time $t_2$-12a. In contrast to the write sequence of an illustrative embodiment shown in FIG. 12a, a memory write sequence of a prior art architecture is shown in FIG. 12b. At time $t_0$-12b, a write driver generates a full swing signal on bitline wires connected directly to a column of memory cells. The heavy capacitive load of the memory cells causes a slow signal transient 254 and data is not stored to a memory cell until time $t_3$-12b. FIGS. 12a and 12b illustrate how using a small swing signal on a data bus for a write operation provides faster access of a memory cell by a memory device controller.

Figure 13A:
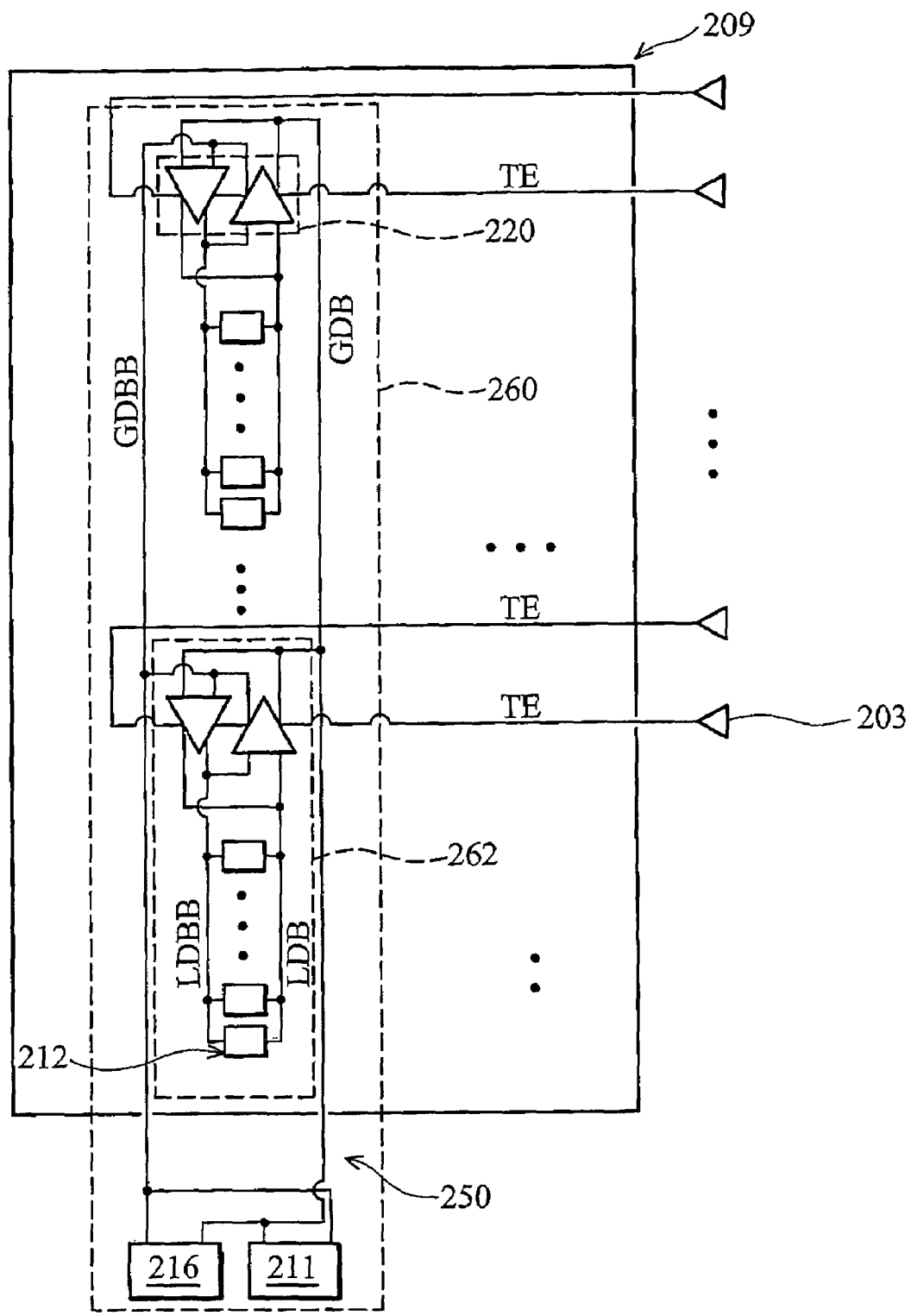
FIG. 13a is a memory device having the access architecture of the present invention in accordance with a third illustrative embodiment of the present invention.
Figure 13B:
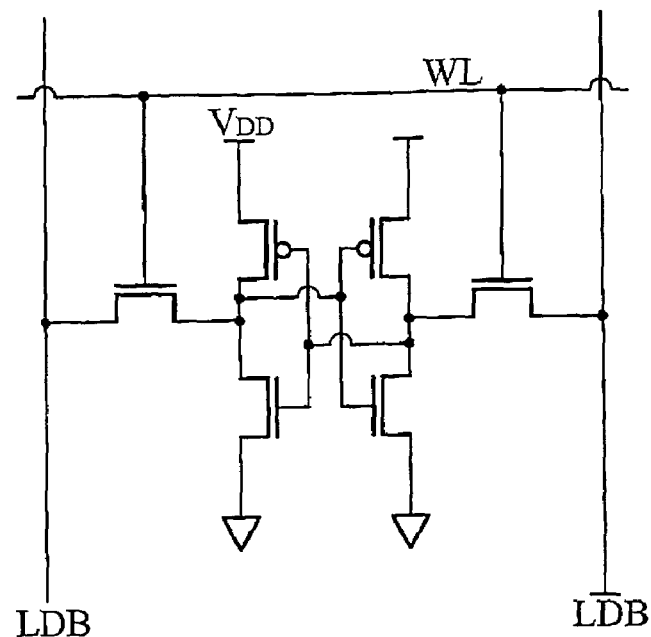
Figure 13C:
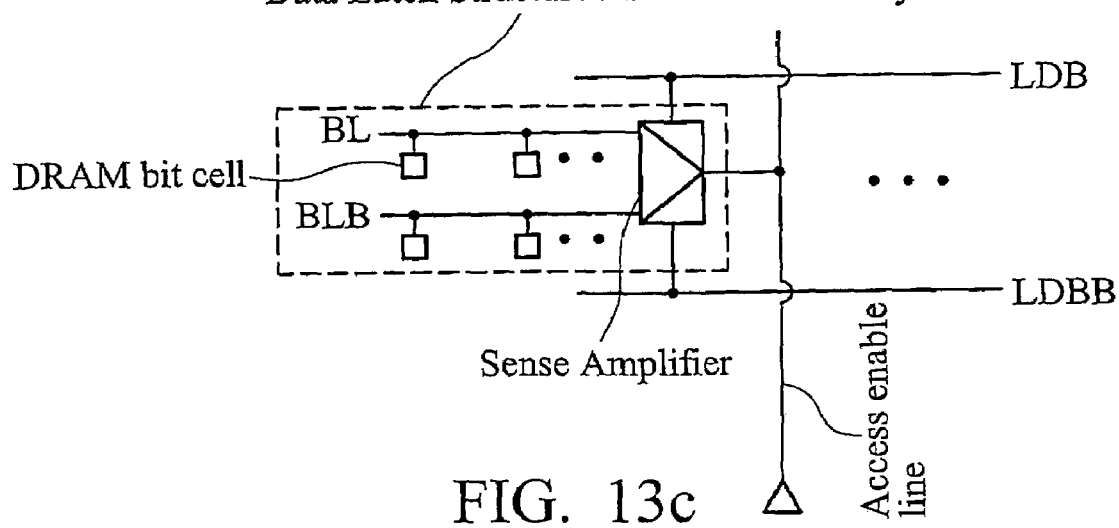
Figure 13D:
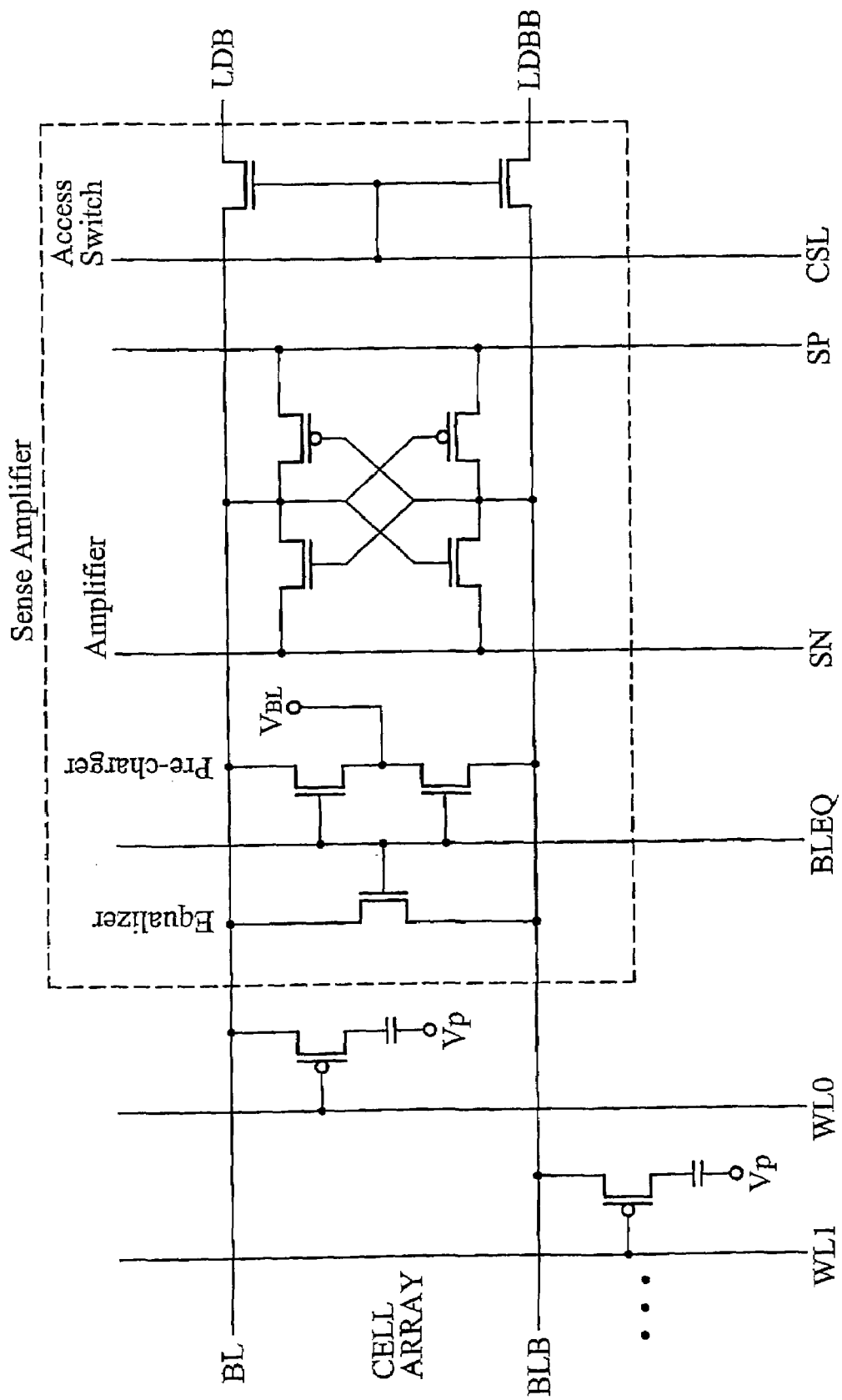
FIG. 13d is a schematic of the sense amplifier in accordance with the data latch comprising DRAM bit cells shown in FIG. 13c.

FIG. 13a shows a third illustrative embodiment that includes the data bus 260 in a memory device. Data latches 212 (also sometimes referred to herein as memory cells) are connected to a transmission buffer 220 by a pair of cross-coupled wires LDB and LDBB to form local data bus 262 in column 209. Repeated dots "..." between local data bus 262 in column 209 show how the local data buses 262 are repeated any number of times in the column 209. An example of the data latch 212 can be the SRAM bit cell as illustrated in FIG. 13b. Another example of the data latch 212 can be a sense amplifier coupled with a plurality of DRAM bit cells, as shown in FIG. 13c. The architecture of the sense amplifier in FIG. 13c is further illustrated in FIG. 13d. In the third embodiment, high-speed architecture for data access is used for a DRAM memory device. The architecture is described as follows. DRAM bit cells are connected to sense amplifier by a pair of wires BL and BLB (bit lines). Sense amplifiers are connected to the transmission buffers 220 by a pair of local data bus LDB and LDBB. The transmission buffers 220 are connected to the write driver 216 and read amplifier 211 by global data buses GDB and GDBB.

Although the present invention and its advantages have been described in detail, it should be understood that various changes, substitutions and alterations can be made herein without departing from the spirit and scope of the invention as defined by the appended claims. As example, it will be readily understood by those skilled in the art that high-speed access architecture for semiconductor memory may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor memory device comprising:
   a first device electrically connected to a first plurality of wires, the first device being adapted to generate a small swing signal in the first plurality of wires;
   a second device electrically connected to the first device by the first plurality of wires; and
   a memory cell electrically connected to the second device by a second plurality of wires, wherein the second device is adapted to sense the small swing signal in the first plurality of wires, and to generate a full swing signal on the second plurality of wires in response to the small swing signal, and wherein the memory cell stores the full swing signal.

2. The memory device of claim 1, wherein the first device comprises a write driver and the second device comprises a write buffer.

3. The memory device of claim 1, wherein the first plurality of wires has two wires and the second plurality of wires has two wires.

4. The memory device of claim 1, wherein the first plurality of wires has four wires and the second plurality of wires has two wires.

5. The memory device of claim 1, further comprising:
   a third device electrically connected to the second plurality of wires; and
   a fourth device electrically connected to the third device by the first plurality of wires.

6. The memory device of claim 5, wherein the first plurality of wires, the first device, the second device, the third device, and the fourth device form a global bi-directional bus, and wherein the second plurality of wires, the second device, the third device, and the memory cell form a local bi-directional bus.

7. The memory device of claim 5, wherein the third device comprises a read buffer, and wherein the fourth device comprises a read amplifier.

8. The memory device of claim 1, further comprising:
   a third device electrically connected to the memory cell by the second plurality of wires, wherein the third device is adapted to sense the small swing signal in the second plurality of wires, and to generate the small swing signal on the first plurality of wires in response to the small swing signal.

9. The memory device of claim 8, further comprising:
   a fourth device electrically connected to the third device by the first plurality of wires.

10. The memory device of claim 9, wherein the third device comprises a read buffer, and wherein the fourth device comprises a read amplifier.

11. The memory device of claim 1, wherein the memory device comprises a static random access memory (SRAM) cell.

12. The memory device of claim 1, wherein the memory device comprises a dynamic random access memory (DRAM) cell.

13. The memory device of claim 12, wherein the memory device further comprises a sense amplifier.

14. The memory device of claim 1, further comprising an interface buffer for communication with devices external to the memory device.

15. A semiconductor memory access architecture comprising:
    a first device electrically connected to a first pair of wires, wherein the first device is adapted to generate a small swing signal in the first pair of wires;
    a second device electrically connected to the first device by the first pair of wires, wherein the second device is adapted to sense the first small swing signal in the first pair of wires and in response generate a full swing signal in a second pair of wires;
    a memory cell electrically connected to the second device by a second pair of wires, wherein the memory cell stores the full swing signal, wherein the memory cell is adapted to generate a second small swing signal in the second pair of wires; and
    a third device electrically connected to the memory cell by the second pair of wires, wherein upon sensing the second small swing signal in the second pair of wires the third device generates a third small swing signal in the third pair of wires, and wherein the third device is electrically connected to a fourth device by a third pair of wires.

16. The semiconductor memory access architecture of claim 15, wherein the first device comprises a write driver, wherein the second device comprises a write buffer, wherein the third device comprises a read buffer, and wherein the fourth device comprises a read amplifier.

17. A semiconductor memory access architecture comprising:
    a first device electrically connected to a first pair of wires, wherein the first device is adapted to generate a first small swing signal in the first pair of wires;
    a second device electrically connected to the first device by the first pair of wires, wherein the second device is adapted to sense the first small swing signal in the first pair of wires and in response generate a full swing signal in a second pair of wires;

a memory cell electrically connected to the second device by the second pair of wires, wherein the memory cell stores the full swing signal, wherein the memory cell is adapted to generate a second small swing signal in the second pair of wires; and a third device electrically connected to the memory cell by the second pair of wires, wherein upon sensing the second small swing signal in the second pair of wires the third device generates a third small swing signal in the third pair of wires, and wherein the third device is electrically connected to the fourth device and to the first device by the first pair of wires.

18. The memory access architecture of claim 17, wherein the first device comprises a write driver, wherein the second device comprises a write buffer, wherein the third device comprises a read buffer, and wherein the fourth device comprises a read amplifier.

19. A method of memory device operation comprising:

writing to a first memory cell, wherein the writing to the first memory cell comprises generating a first small swing signal onto a first pair of wires, wherein the first small swing signal is generated by a write driver electrically connected to a first transmission buffer by the first pair of wires, sensing the first small swing signal on the first pair of wires and generating a first full swing signal on a second pair of wires in response to the first small swing signal, wherein the second pair of wires electrically connect the first transmission buffer to the first memory cell, and storing the first full swing signal in the first memory cell; and reading from a second memory cell, wherein the reading from the second memory cell comprises generating a second small swing signal onto a third pair of wires, the second small swing signal being generated by the second memory cell, the second memory cell being electrically connected to a second transmission buffer by the third pair of wires, sensing the second small swing signal on the third pair of wires and generating a third small swing signal on a fourth pair of wires in response to the second small swing signal, wherein the fourth pair of wires electrically connect a read amplifier to the second transmission buffer; and wherein the writing to the first memory cell and the reading from the second memory cell are performed independently with respect to time.

* * * * *